US010686446B2

(12) United States Patent
Ng et al.

(10) Patent No.: US 10,686,446 B2
(45) Date of Patent: *Jun. 16, 2020

(54) POWER GATED LOOKUP TABLE CIRCUITRY

(71) Applicant: Altera Corporation, San Jose, CA (US)

(72) Inventors: Bee Yee Ng, Bayan Lepas (MY); Hee Kong Phoon, Bagan Serai (MY); Teik Hong Ooi, Bagan Serai (MY); Guan Hoe Oh, Alo Setar (MY)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/633,322

(22) Filed: Jun. 26, 2017

(65) Prior Publication Data

US 2017/0294914 A1    Oct. 12, 2017

Related U.S. Application Data

(63) Continuation of application No. 14/994,864, filed on Jan. 13, 2016, now Pat. No. 9,705,504.

(51) Int. Cl.
*H03K 19/17728* (2020.01)
*H03K 19/1776* (2020.01)
*H03K 19/00* (2006.01)
*H03K 19/173* (2006.01)

(52) U.S. Cl.
CPC ... *H03K 19/17728* (2013.01); *H03K 19/0016* (2013.01); *H03K 19/1737* (2013.01); *H03K 19/1776* (2013.01)

(58) Field of Classification Search
None
See application file for complete search history.

(56) References Cited

U.S. PATENT DOCUMENTS

| 5,442,306 | A | 8/1995 | Woo |
| 5,955,912 | A | 9/1999 | Ko |
| 6,118,300 | A | 9/2000 | Wittig |
| 6,353,920 | B1 | 3/2002 | Wittig et al. |
| 6,943,589 | B2 | 9/2005 | Dobberphul |
| 6,998,872 | B1 | 2/2006 | Chirania et al. |
| 7,358,761 | B1 | 4/2008 | Sunkavalli et al. |
| 7,428,722 | B2 | 9/2008 | Sunkavalli et al. |
| 2007/0240094 | A1 | 10/2007 | Anshumali et al. |

(Continued)

*Primary Examiner* — Jany Richardson

(57) ABSTRACT

A programmable integrated circuit with lookup table circuitry is provided. The lookup table (LUT) circuitry may be formed using multiplexers. A multiplexer in the lookup table circuitry may be implemented using only tristate inverting circuits. Each tristate inverting circuit may include a first set of n-channel and p-channel transistors that receive a static control bit from a memory element and a second set of n-channel and p-channel transistors that receive true and complementary versions of a user signal. The first and second sets of transistors may be coupled in series between a positive power supply terminal and a ground power supply terminal. A LUT multiplexer implemented in this way need not include separate transmission gates at the output of each tristate inverting circuit and may exhibit minimal subthreshold leakage.

20 Claims, 9 Drawing Sheets

(56) References Cited

U.S. PATENT DOCUMENTS

2008/0197879 A1* 8/2008 Leung .............. H03K 19/17728
                                                      326/44
2010/0054324 A1   3/2010 Bulzacchelli et al.
2014/0204660 A1   7/2014 Chandwani et al.

* cited by examiner

POWER GATED LOOKUP TABLE CIRCUITRY

This application is a continuation of patent application Ser. No. 14/994,864, filed Jan. 13, 2016, which is hereby incorporated by reference herein in its entirety. This application claims the benefit of and claims priority to patent application Ser. No. 14/994,864, filed Jan. 13, 2016.

BACKGROUND

This relates to integrated circuits and, more particularly, to programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. These tools help the designer implement the custom logic circuit using the resources available on a given programmable integrated circuit. When the design process is complete, the CAD tools generate configuration data files. The configuration data is loaded into programmable devices to configure them to perform the desired custom logic function.

A conventional programmable integrated circuit typically includes thousands of lookup tables (LUTs). Each LUT is implemented using multiple stages of multiplexers. As an example, a 4-input LUT may include four 4-input multiplexers in a first stage, two 2-input multiplexers in a second stage, and one 2-input multiplexer in a third stage. Each 4-input multiplexer has a first input terminal that is connected to an output terminal via a first inverter and a first transmission gate, a second input terminal that is connected to the output terminal via a second inverter and a second transmission gate, a third input terminal that is connected to the output terminal via a third inverter and a third transmission gate, and a fourth input terminal that is connected to the output terminal via a fourth inverter and a fourth transmission gate. The four transmission gates are controlled by various combinations of true and complementary versions of two control bits such that only one of the four transmission gates is turned one at any point in time.

In newer process technology nodes, the transmission gates are sometimes implemented using pass transistors that suffer from increased leakage. Keeping the current design of the LUTs would therefore lead to an unacceptable increase in power consumption. It is within this context that the embodiments described herein arise.

SUMMARY

This relates generally to integrated circuits and, in particular, to integrated circuits with configurable lookup table circuits.

In accordance with an embodiment, a lookup table circuit is provided that includes a multiplexer having an output, a first tristate inverting circuit that is directly connected to the output and a second tristate inverting circuit that is directly connected to the output. The lookup table circuit may also include a first memory element that provides a first static control bit to the first tristate inverting circuit and a second memory element that provides a second static control bit to the second tristate inverting circuit.

The first tristate inverter may include an n-channel transistor and a p-channel transistor that both receive the first static control bit. The first tristate inverter may also include an additional n-channel transistor that receives a user signal and an additional p-channel transistor that receives an inverted version of the user signal. The first and second tristate inverting circuits may receive different user signals such that only one of the first and second tristate inverting circuits is turned on during normal operation of the integrated circuit. Each of the first and second tristate inverting circuits may include at least three transistors connected in series, at least four transistors connected in series, etc.

In accordance with another suitable embodiment, an integrated circuit lookup table circuit is provided that includes a multiplexing circuit having an output, first and second memory cells, a first inverting circuit that is coupled between the first memory cell and the output and that includes a first sleep transistor, and a second inverting circuit that is coupled between the second memory cell and the output and that includes a second sleep transistor. The lookup table circuit may also include a first transmission gate coupled between the first inverting circuit and the output and a second transmission gate coupled between the second inverting circuit and the output.

The lookup table circuit may include power gating control circuitry that provides sleep control signals to the first and second sleep transistors. Each of the first and second inverting circuits may contain at least three series-connected transistors. In some arrangements, the first sleep transistor receives the same control signal as the first transmission gate, and wherein the second sleep transistor receives the same control signal as the second transmission gate.

Further features of the invention, its nature and various advantages will be more apparent from the accompanying drawings and following detailed description.

DETAILED DESCRIPTION

Embodiments of the present invention relate to integrated circuits such as programmable integrated circuits and more particularly to circuitry that implements lookup table circuitry on the programmable integrated circuits.

As described above, programmable integrated circuits often include hundreds or thousands of lookup tables. The design of each of these lookup tables is therefore critical, and even an incremental change can have a large impact on the entire integrated circuit. Current lookup table designs suffer from high levels of leakage. It would therefore be desirable to provide improved lookup tables with reduced leakage levels.

It will be recognized by one skilled in the art, that the present exemplary embodiments may be practiced without some or all of these specific details. In other instances, well-known operations have not been described in detail in order not to unnecessarily obscure the present embodiments.

Figure 1:
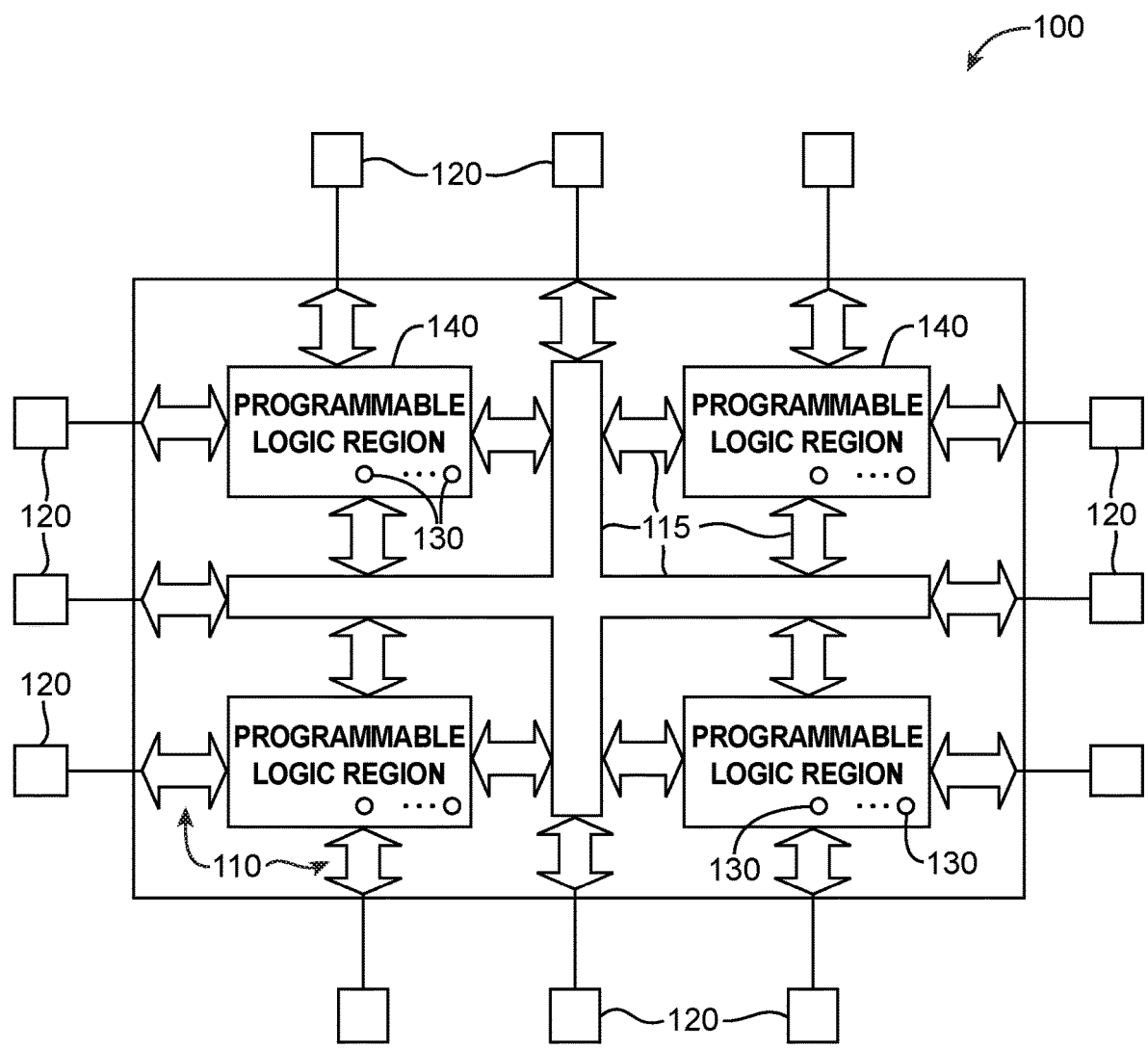
FIG. 1 is a diagram of an illustrative programmable integrated circuit with programmable logic regions in accordance with an embodiment.

An illustrative embodiment of an integrated circuit such as a programmable logic device 100 in accordance with the present invention is shown in FIG. 1.

Programmable logic device 100 has input-output (I/O) circuitry 110 for driving signals off of device 100 and for receiving signals from other devices via input-output (I/O) pins 120. Interconnection resources 115 such as global and local vertical and horizontal conductive lines and buses may be used to route signals on device 100.

Input-output (I/O) circuitry 110 include conventional input-output (I/O) circuitry, serial data transceiver circuitry, differential receiver and transmitter circuitry, or other circuitry used to connect one integrated circuit to another integrated circuit.

Interconnection resources 115 include conductive lines and programmable connections between respective conductive lines and are therefore sometimes referred to as programmable interconnects 115.

Programmable logic region 140 may include programmable components such as digital signal processing circuitry, storage circuitry, arithmetic circuitry such as adders arranged in carry chains, or other combinational and sequential logic circuitry such as configurable register circuitry. As an example, the configurable register circuitry may operate as a conventional register. Alternatively, the configurable register circuitry may operate as a random-access memory.

The programmable logic region 140 may be configured to perform a custom logic function. The programmable logic region 140 may also include specialized blocks that perform a given application and have limited configurability. For example, the programmable logic region 140 may include specialized blocks such as configurable storage blocks, configurable processing blocks, programmable phase-locked loop circuitry, programmable delay-locked loop circuitry, or other specialized blocks with limited configurability. The programmable interconnects 115 may also be considered to be a type of programmable logic region 140.

Programmable logic device 100 may also contain programmable memory elements 130. Memory elements 130 can be loaded with configuration data (also called programming data) using pins 120 and input-output (I/O) circuitry 110. Once loaded, the memory elements each provide a corresponding static control signal that controls the operation of an associated logic component in programmable logic region 140. In a typical scenario, the outputs of the loaded memory elements 130 are applied to the gates of metal-oxide-semiconductor transistors in programmable logic region 140 to turn certain transistors on or off and thereby configure the logic in programmable logic region 140 and routing paths. Programmable logic circuit elements that may be controlled in this way include parts of multiplexers (e.g., multiplexers used for forming routing paths in programmable interconnects 115), look-up tables, logic arrays, AND, OR, NAND, and NOR logic gates, pass gates, etc.

Memory elements 130 may use any suitable volatile and/or non-volatile memory structures such as random-access-memory (RAM) cells, fuses, antifuses, programmable read-only-memory memory cells, mask-programmed and laser-programmed structures, combinations of these structures, etc. Because memory elements 130 are loaded with configuration data during programming, memory elements 130 are sometimes referred to as configuration memory, configuration RAM, or programmable memory elements.

The circuitry of device 100 may be organized using any suitable architecture. As an example, the logic of programmable logic device 100 may be organized in a series of rows and columns of larger programmable logic regions each of which contains multiple smaller logic regions. The smaller regions may be, for example, regions of logic that are sometimes referred to as logic elements (LEs), each containing a look-up table, one or more registers, and programmable multiplexer circuitry. The smaller regions may also be, for example, regions of logic that are sometimes referred to as adaptive logic modules (ALMs), configurable logic blocks (CLBs), slice, half-slice, etc. Each adaptive logic module may include a pair of adders, a pair of associated registers and a look-up table or other block of shared combinational logic (i.e., resources from a pair of LEs— sometimes referred to as adaptive logic elements or ALEs in this context). The larger regions may be, for example, logic array blocks (LABs) or logic clusters of regions of logic containing for example multiple logic elements or multiple ALMs.

During device programming, configuration data is loaded into device 100 that configures the programmable logic regions 140 so that their logic resources perform desired logic functions. For example, the configuration data may configure a portion of the configurable register circuitry to operate as a conventional register. If desired, the configuration data may configure some of the configurable register circuitry to operate as a register with error detection and error correction capabilities.

Figure 2:
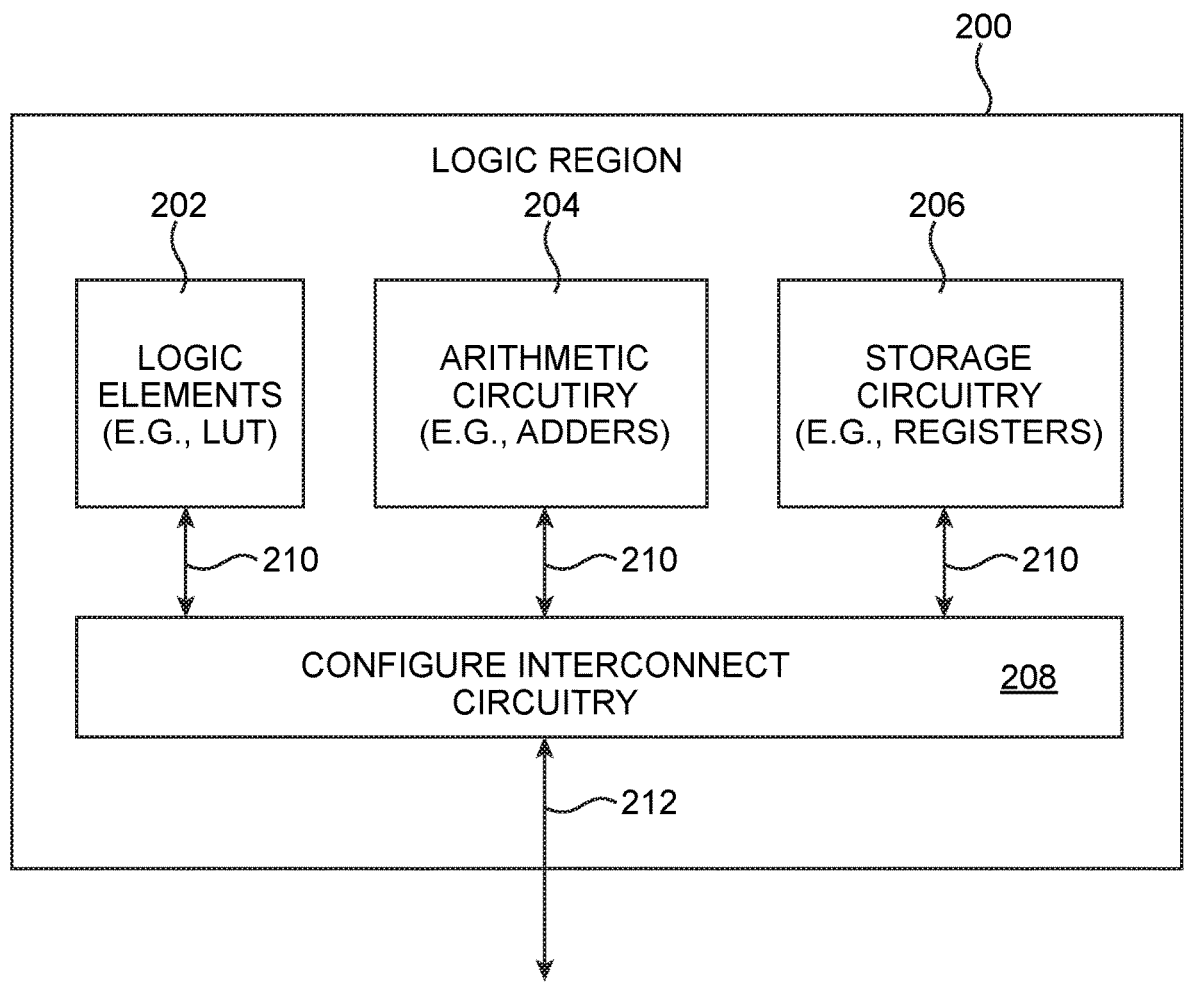
FIG. 2 is a diagram of an illustrative logic region in accordance with an embodiment.

FIG. 2 shows an illustrative diagram of a logic region 200. As shown in FIG. 2, logic region 200 may include logic elements 202, arithmetic circuitry such as adder circuitry 204, storage circuitry such as register circuitry 206, and configurable interconnect circuitry 208. Logic elements 202 may include one or more configurable look-up tables. For example, logic elements may include four 3-input look-up tables which may be configured to implement two independent 4-input look-up tables, one 5-input look-up table, or two 5-input look-up tables which share at least two inputs, etc.

Arithmetic circuitry 204 may include one or more adders. Each of these adders may implement a half-adder, a full-adder, a carry-save adder, a carry-select adder, a ripple-carry adder, a carry-lookahead adder, or any other suitable adder circuitry.

Storage circuitry 206 may include registers, latches, time-borrowing flip-flops (TBFF), or any other synchronous circuitry that is controlled by a clock signal. If desired, register circuitry 206 may contain several different synchronous elements such as registers and latches, or registers and time-borrowing flip-flops, just to name a few combinations.

Internal interconnection resources 210 such as conductive lines and busses may be used to send data from one component to another component or to broadcast data from one component to one or more other components. External interconnection resources 212 such as conductive lines and busses may be used to communicate with external components. External interconnection resources 212 may convey data signals between logic region 200 and external components. If desired, external interconnection resources may also convey control signals such as clock signals, asynchronous reset signals, etc.

Configurable interconnect circuitry 208 couples logic elements 202, adder circuitry 204, and register circuitry 206 with each other through internal interconnection resources 210 and to external components through external interconnection resources 212. Configurable interconnect circuitry 208 may include memory elements (e.g., memory elements 130 of FIG. 1) which may be loaded with configuration data during device programming.

Figure 3:
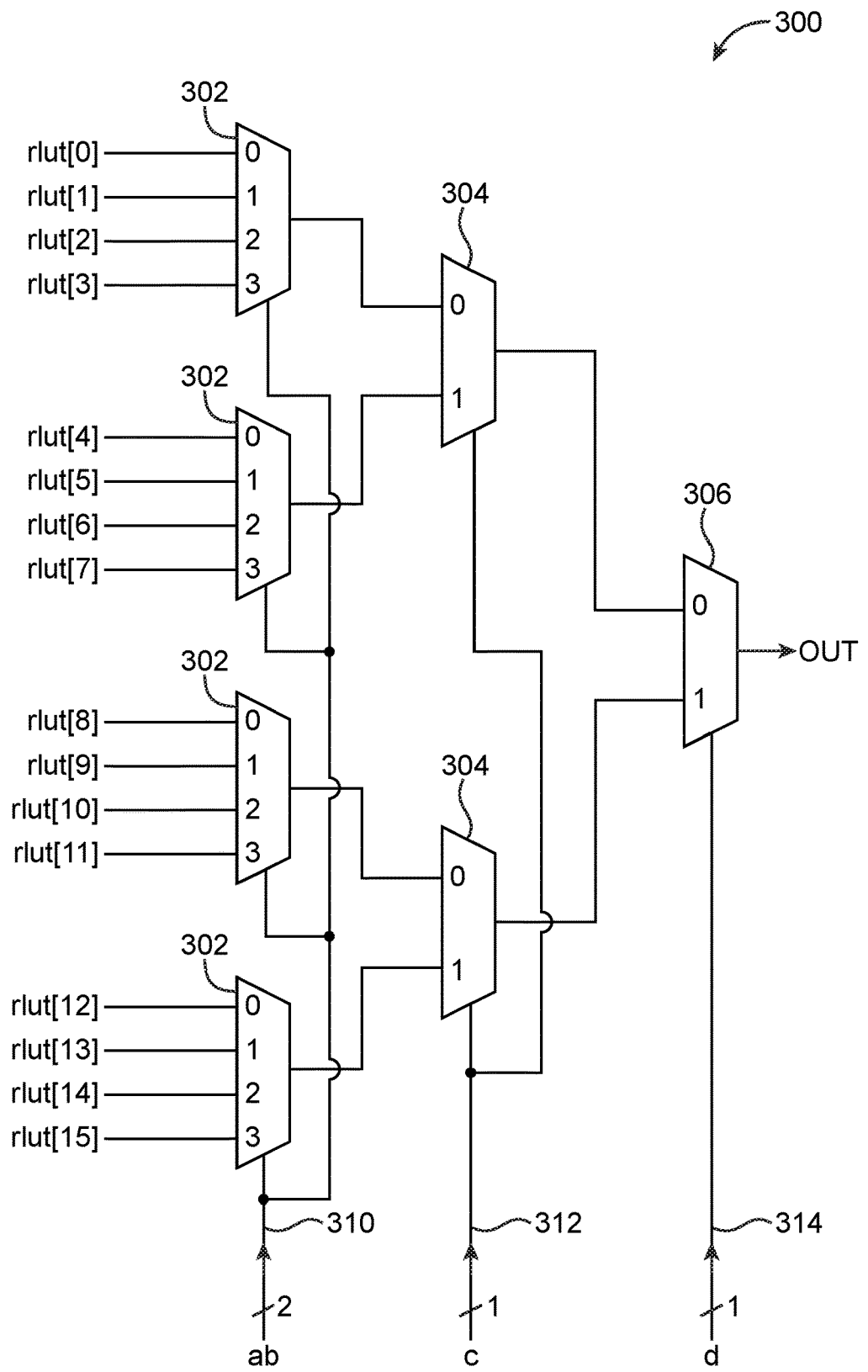
FIG. 3 is a diagram of an illustrative 4-input lookup table (LUT) in accordance with an embodiment.

Each logic element 202 may include one or more lookup table (LUT) circuit. FIG. 3 is a diagram of an illustrative 4-input lookup table 300 in accordance with an embodiment. As shown in FIG. 3, LUT 300 may include four 4:1 multiplexers 302, two 2:1 multiplexers 304, and one 2:1 multiplexer 306. Lookup table 300 may receive sixteen static control bits rlut[15:0], each of which is stored in a corresponding random-access memory (RAM) element such as a configuration RAM. Static control bits rlut[15:0] may sometimes be collectively referred to as a "LUT mask."

In particular, a first multiplexer 302 may receive mask bits rlut[3:0]; a second multiplexer 302 may receive mask bits rlut[7:4]; a third multiplexer 302 may receive mask bits rlut[11:8]; and a fourth multiplexer 302 may receive mask bits rlut[15:12]. The four multiplexers 302 may be controlled using user input signals a and b provided via path 310. Depending on the state of signals a and b, multiplexer 302 may be configured to route to its output a signal from a selected on of its four inputs.

A first multiplexer 304 may have a first (0) input that receives an output signal from first multiplexer 302 and a second (1) input that receives an output signal from second multiplexer 302. Similarly, a second multiplexer 304 may have a first (0) input that receives an output signal from third multiplexer 302 and a second (1) input that receives an output signal from fourth multiplexer 302. The two multiplexers 304 may be controlled using user input signal c provided via path 312. Depending on the state of signal c, multiplexer 304 may be configured to route to its output a signal from a selected one of its two inputs.

Multiplexer 306 may have a first (0) input that receives an output signal from first multiplexer 304 and a second (1) input that receives an output signal from second multiplexer 304. Multiplexer may be controlled using user input signal d provided via path 314. Depending on the state of signal d, multiplexer may be configured to route to its output a signal from a selected one of its two inputs.

The 4-input LUT implementation of FIG. 3 is merely illustrative and does not serve to limit the scope of the present invention. In general, programmable integrated circuit die 100 (FIG. 1) may have 4-input LUTs implemented using other suitable combinations of multiplexers and may also input 2-input LUTs, 8-input LUTs, 16-input LUTs, etc.

Figure 4:
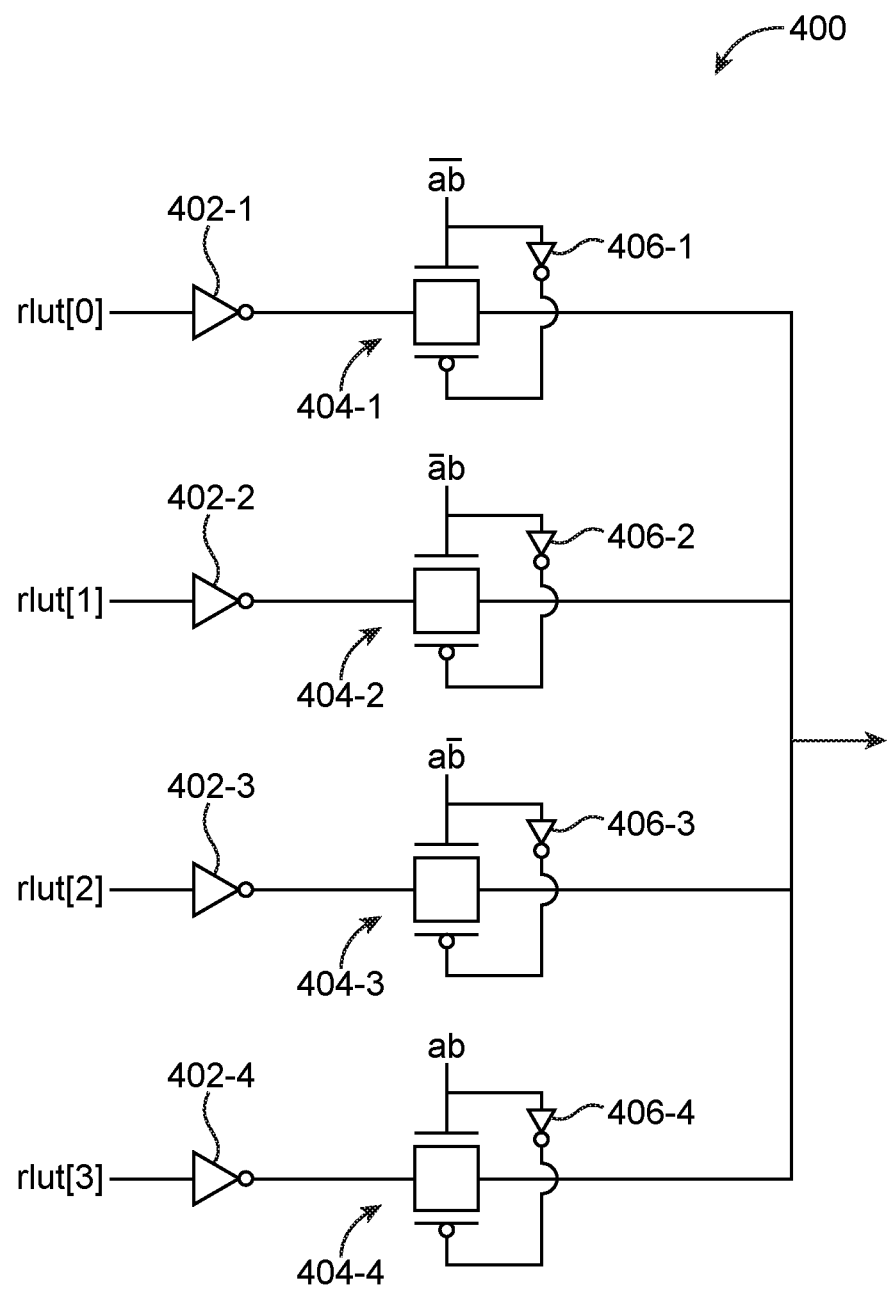
FIG. 4 is a circuit diagram of a 4:1 multiplexer.

FIG. 4 shows one suitable implementation of a 4:1 multiplexer 400. Multiplexer 400 may be used as multiplexer 302 of FIG. 3. As shown in FIG. 4, multiplexer 400 has a first data input that receives bit rlut[0], a second data input that receives bit rlut[1], a third data input that receives bit rlut[2], a fourth data input that receives bit rlut[3], and an output. The first data input is coupled to the output via a first inverter 402-1 and a first transmission gate 404-1. The second data input is coupled to the output via a second inverter 402-2 and a second transmission gate 404-2. The third data input is coupled to the output via a third inverter 402-3 and a third transmission gate 404-3. The fourth data input is coupled to the output via a fourth inverter 402-4 and a fourth transmission gate 404-4. Each inverter 402 includes only an n-type metal-oxide-semiconductor (NMOS) transistor and a p-type metal-oxide-semiconductor (PMOS) transistor connected in series between a positive power supply terminal and a ground terminal.

First transmission gate 404-1 includes an NMOS transistor that receives signal $\overline{ab}$ and a PMOS transistor that receives an inverted version of signal $\overline{ab}$. Signal $\overline{ab}$ is asserted only when a and b are both low. Second transmission gate 404-2 includes an NMOS transistor that receives signal $\overline{a}$ b and a PMOS transistor that receives an inverted version of signal $\overline{a}$ b. Signal $\overline{a}$ b is asserted only when a is low and b is high. Third transmission gate 404-3 includes an NMOS transistor that receives signal a $\overline{b}$ and a PMOS transistor that receives an inverted version of signal a $\overline{b}$. Signal a $\overline{b}$ is asserted only when a is high and b is low. Fourth transmission gate 404-4 includes an NMOS transistor that receives signal ab and a PMOS transistor that receives an inverted version of signal ab. Signal ab is asserted only when a and b are both high. Connected in this way, only one of the four transmission gates 404 is turned on at any given point in time depending on the values of a and b.

The multiplexer implementation of FIG. 4 may be especially prone to high leakage. In particular, there is a DC (direct current) leakage path at every inverter 402. It would therefore be desirable to provide ways of reducing the amount of subthreshold leakage of each inverter in a LUT multiplexer.

Figure 5:
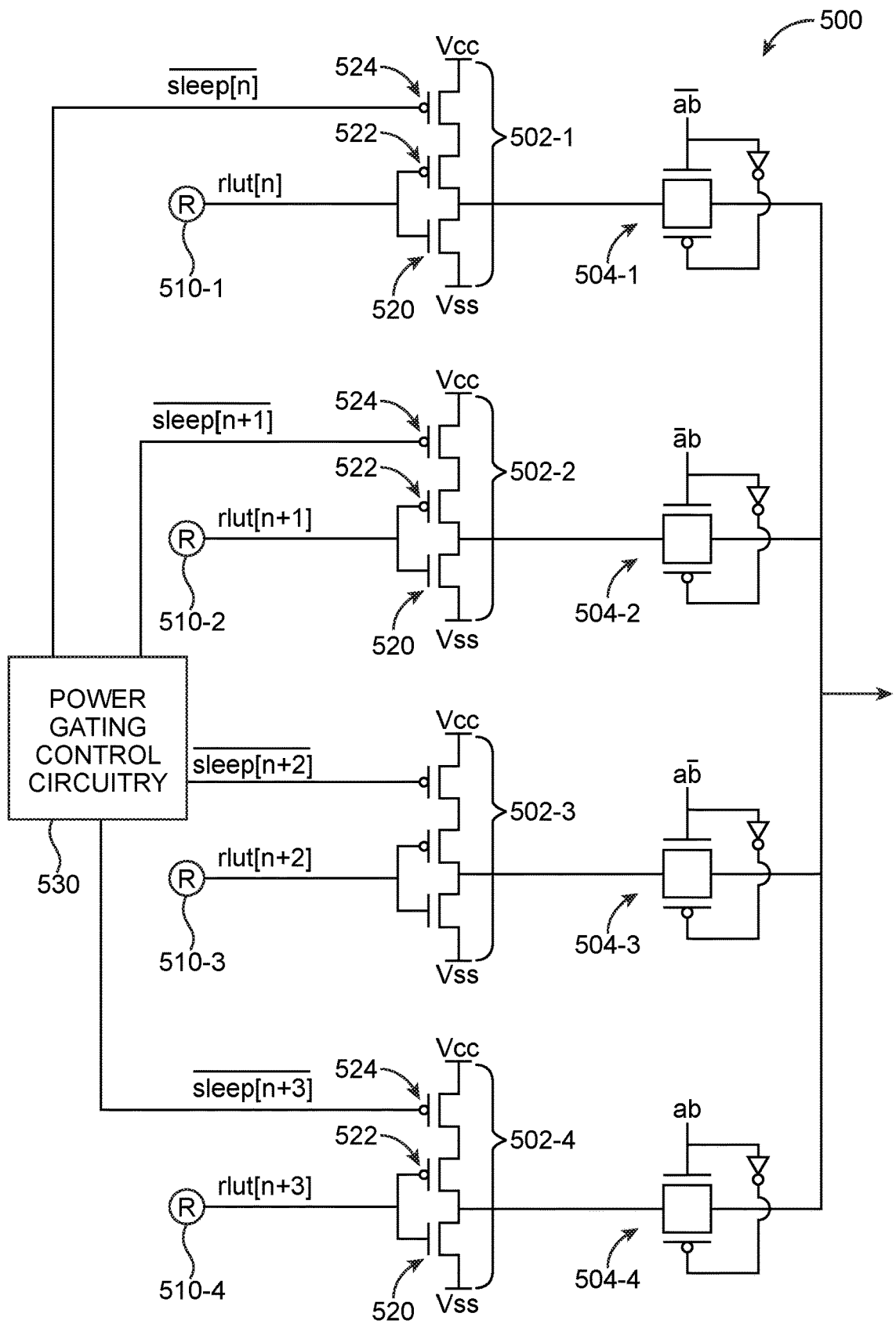
FIG. 5 is a circuit diagram of an illustrative multiplexer having sleep transistors that are controlled by power gating control circuitry in accordance with an embodiment.

In accordance with an embodiment of the present invention, FIG. 5 shows an illustrative multiplexer 500 having sleep transistors that help to substantially reduce leakage. Multiplexer 500 may be used as multiplexer 302 of FIG. 3. As shown in FIG. 5, multiplexer 500 may include a first inverting circuit 502-1, a second inverting circuit 502-2, a third inverting circuit 502-3, and a fourth inverting circuit 502-4. The four inverting circuits 502 (e.g., circuits 502-1, 502-2, 502-3, and 502-4) may be coupled to the multiplexer output via four respective transmission gates 504-1, 504-2, 504-3, and 504-4.

In particular, each of the inverting circuits 502 may include an n-channel transistor 520, a p-channel transistor 522, and a p-channel sleep transistor 524 coupled in series between positive power supply line Vcc and ground power supply line Vss. Transistors 520 and 522 may have gates that are shorted together to receive a respective mask bit from a memory element. In the example of FIG. 5, inverting circuit 502-1 receives static control bit rlut[n] from RAM cell 510-1; inverting circuit 502-2 receives static control bit rlut[n+1] from RAM cell 510-2; inverting circuit 502-3 receives static control bit rlut[n+2] from RAM cell 510-3; and inverting circuit 502-4 receives static control bit rlut[n+3] from RAM cell 510-4.

Still referring to FIG. 5, multiplexer 500 may be provided with control circuitry such as power gating control circuitry 530 that provide control signals to the sleep transistors. Power gating control circuitry 530 may provide a first control signal/sleep[n] to sleep transistor 524 in the first inverting circuit 502-1, a second control signal/sleep[n+1] to sleep transistor 524 in the second inverting circuit 502-2, a third control signal/sleep[n+2] to sleep transistor 524 in the third inverting circuit 502-3, and a fourth control signal/sleep[n+3] to sleep transistor 524 in the fourth inverting circuit 502-4. The "/" indicate that these sleep control signals are active-low signals (e.g., transistor 524 may be turned on when the sleep signals are low).

Configured in this way, any unused inverting circuits 502 may be placed in sleep mode by selectively turning off sleep transistor 524. The use of sleep transistor 524 in each inverting circuit 502 can help dramatically reduce the amount of leakage in multiplexer 500. The use of p-channel sleep transistors 524 in FIG. 5 is merely illustrative. If desired, multiplexer 500 may be implemented using only n-channel sleep transistors coupled between transistors 520 and ground line Vss. The n-channel sleep transistors may be controlled by active-high signals produced using power gating control circuitry 530.

Figure 6:
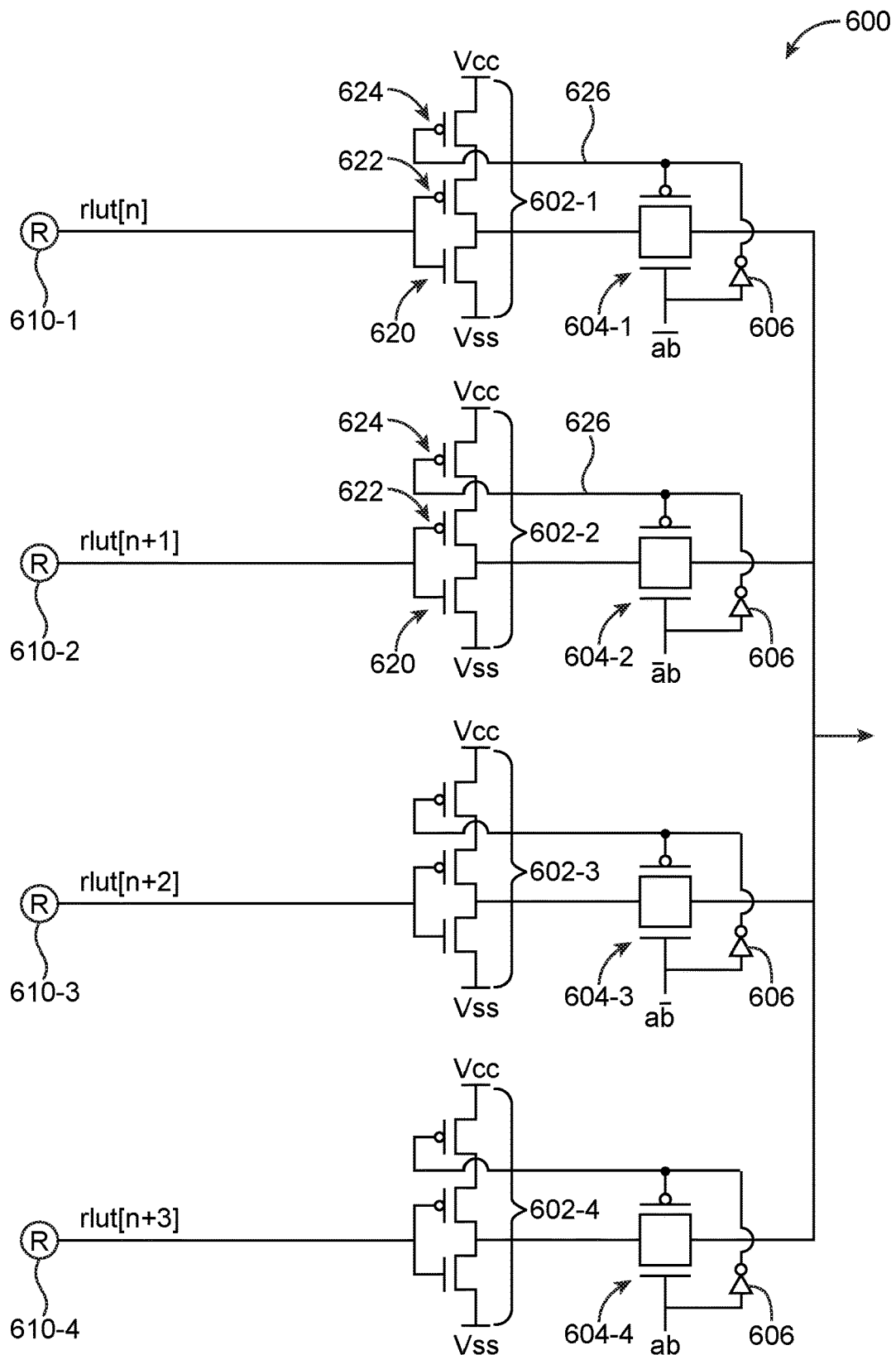
FIG. 6 is a circuit diagram of an illustrative multiplexer having sleep transistors that are controlled using input signals in accordance with an embodiment.

FIG. 6 shows another suitable embodiment of a LUT multiplexer 600 having sleep transistors that are controlled directly using the user input signals instead of the power gating control circuitry 530 of FIG. 5. Multiplexer 600 may also be used as multiplexer 302 of FIG. 3. As shown in FIG. 6, multiplexer 600 may include a first inverting circuit 602-1, a second inverting circuit 602-2, a third inverting circuit 602-3, and a fourth inverting circuit 602-4. The four inverting circuits 602 (e.g., circuits 602-1, 602-2, 602-3, and 602-4) may be coupled to the multiplexer output via four respective transmission gates 604-1, 604-2, 604-3, and 604-4.

In particular, each of the inverting circuits 602 may include an n-channel transistor 620, a p-channel transistor 622, and a p-channel sleep transistor 624 coupled in series between positive power supply line Vcc and ground power supply line Vss. Transistors 620 and 622 may have gates that are shorted together to receive a respective mask bit from a memory element. In the example of FIG. 6, inverting circuit 602-1 receives static control bit rlut[n] from memory cell 610-1; inverting circuit 602-2 receives static control bit rlut[n+1] from memory cell 610-2; inverting circuit 602-3 receives static control bit rlut[n+2] from memory cell 610-3; and inverting circuit 602-4 receives static control bit rlut[n+3] from memory cell 610-4.

In comparison to FIG. 5, multiplexer 600 need not include a separate power gating control circuitry. Instead, transistor 624 in inverting circuit 602-1 may be controlled by the same signal received by the p-channel transistor in gate 604-1 (i.e., by an inverted version of signal $\overline{ab}$ produced at the output of inverter 606 via path 626). Similarly, transistor 624 in inverting circuit 602-2 may be controlled by the same signal received by the p-channel transistor in gate 604-2 (i.e., by an inverted version of signal $\overline{a}$ b produced at the output of inverter 606 via path 626). Transistor 624 in inverting circuit 602-3 may be controlled by the same signal received by the p-channel transistor in gate 604-3 (i.e., by an inverted version of signal a $\overline{b}$ produced at the output of inverter 606 via path 626). Transistor 624 in inverting circuit 602-4 may be controlled by the same signal received by the p-channel transistor in gate 604-4 (i.e., by an inverted version of signal ab produced at the output of inverter 606 via path 626). Configured in this way, the sleep transistor 624 in each inverting circuit 602 will be automatically deactivated when the corresponding transmission gate is switched out of use.

If desired, multiplexer 600 may also be implemented using only n-channel sleep transistors coupled between transistors 620 and ground line Vss. The n-channel sleep transistors may receive the same signals that are received by the n-channel pass transistor in the corresponding transmission gate 604.

Figure 7:
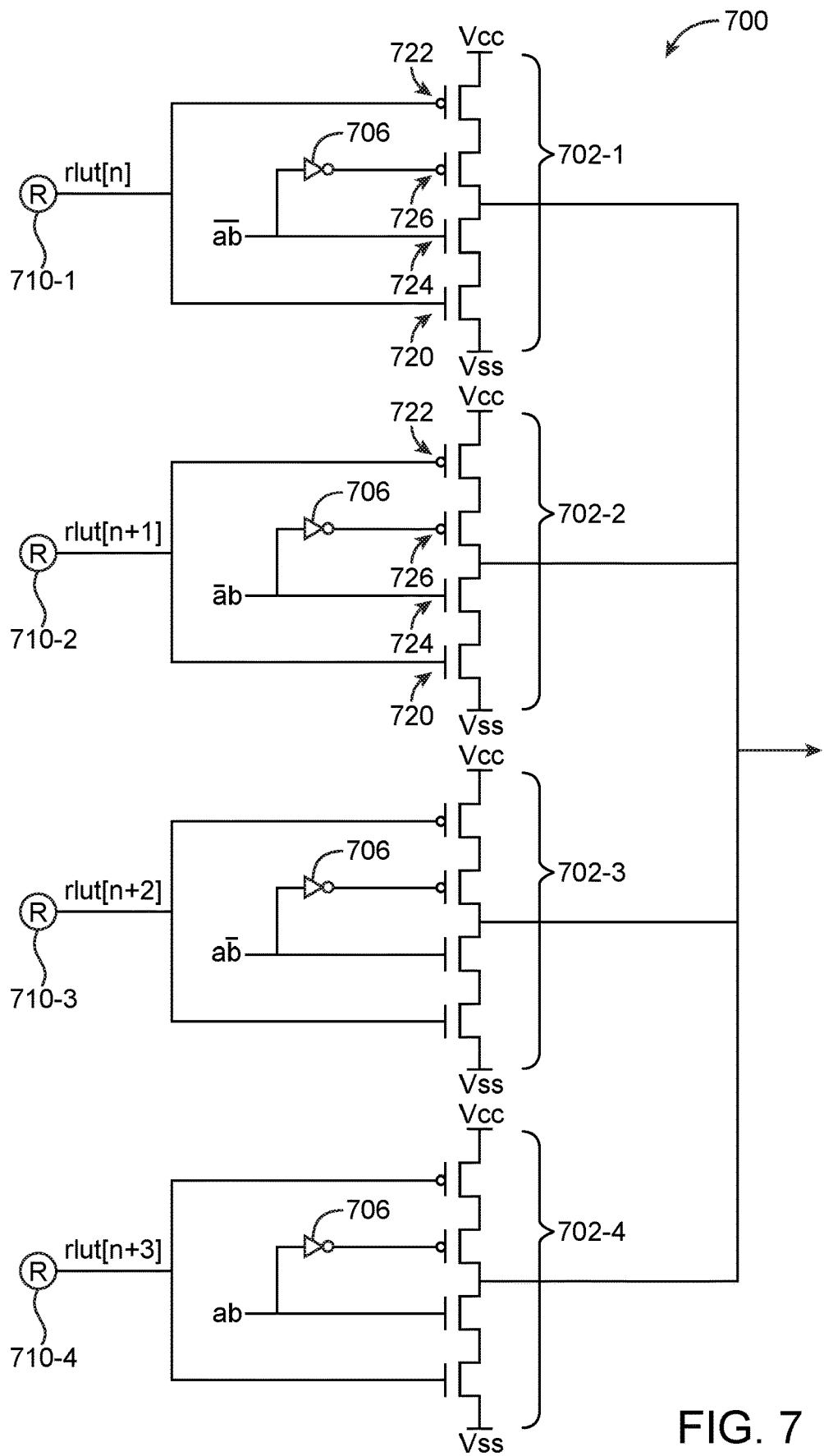
FIG. 7 is a circuit diagram of an illustrative multiplexer implemented using only tristate inverting circuits in accordance with an embodiment.

In accordance with yet another suitable embodiment of the present invention, the functions of the inverting circuit and the transmission gate may be merged into a tristate inverter (e.g., the transmission gate transistors may be folded into the inverting circuit). FIG. 7 is a circuit diagram of an illustrative multiplexing circuit 700 implemented using only tristate inverting circuits. Multiplexer 700 may also be used as multiplexer 302 of FIG. 3. As shown in FIG. 7, multiplexer 700 may include a first tristate inverting circuit 702-1, a second tristate inverting circuit 702-2, a third tristate inverting circuit 702-3, and a fourth tristate inverting circuit 702-4.

Each of the four tristate inverting circuits 702 may include n-channel transistors 720 and 724 and p-channel transistors 722 and 726 coupled in series between power supply lines Vcc and Vss. In particular, transistors 720 and 722 in circuit 702-1 may have their gates shorted together to receive LUT control bit rlut[n] while transistors 724 and 726 in circuit 702-1 receive signal $\overline{ab}$ and the inverted version of signal $\overline{ab}$ through inverter 706, respectively. Similarly, transistors 720 and 722 in circuit 702-2 may have their gates shorted together to receive LUT control bit rlut[n+1] while transistors 724 and 726 in circuit 702-2 receive signal $\overline{a}$ b and the inverted version of signal $\overline{a}$ b through inverter 706, respectively. Transistors 720 and 722 in circuit 702-3 may have their gates shorted together to receive LUT control bit rlut[n+2] while transistors 724 and 726 in circuit 702-3 receive signal a $\overline{b}$ and the inverted version of signal a $\overline{b}$ through inverter 706, respectively. Transistors 720 and 722 in circuit 702-4 may have their gates shorted together to receive LUT control bit rlut[n+3] while transistors 724 and 726 in circuit 702-4 receive signal ab and the inverted version of signal ab through inverter 706, respectively.

In comparison to multiplexer 400 of FIG. 4, multiplexer 700 of FIG. 7 includes the same total number of transistors but exhibits substantially lower leakage due to the series stacking of transistors. Each inverter 402 only includes two series-connected transistors. In contract, each tristate inverting circuit 702 includes four series-connected transistors, which helps to minimize subthreshold leakage at no additional area cost. Multiplexer 700 also does not require any additional control signals to be generated.

Figure 8A:
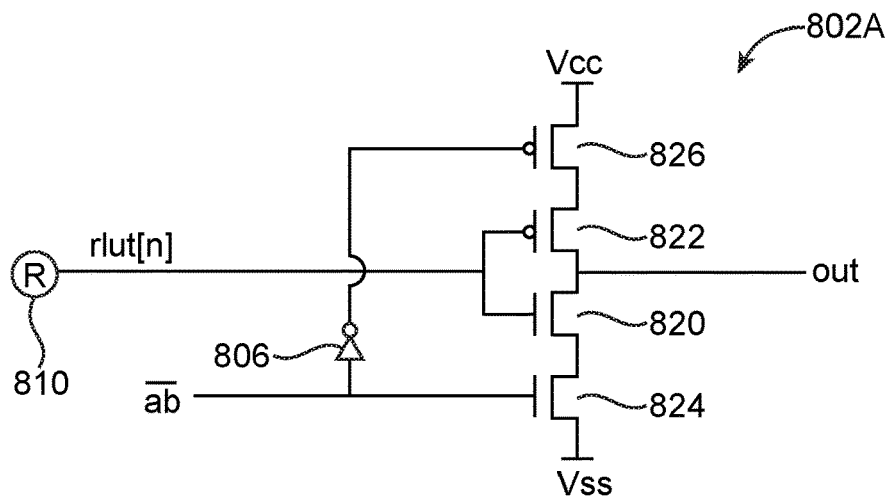
FIGS. 8A-8E show various implementations of a tristate inverting circuit in accordance with some embodiments.

FIGS. 8A-8E show various implementations of a tristate inverting circuit that can be used in multiplexer 700 in accordance with some embodiments. FIG. 8A shows how the order of the transistors may be switched around without affecting the function of the tristate inverter. As shown in FIG. 8A, tristate inverter 802A may include p-channel transistors 826 and 822 and n-channel transistors 820 and 824 connected in series between Vcc and Vss in that order. Transistors 822 and 820 may have gates that receive static control bit rlut[n] from memory element 810 while transistors 826 and 824 may be selectively activated using user input signals.

Figure 8B:
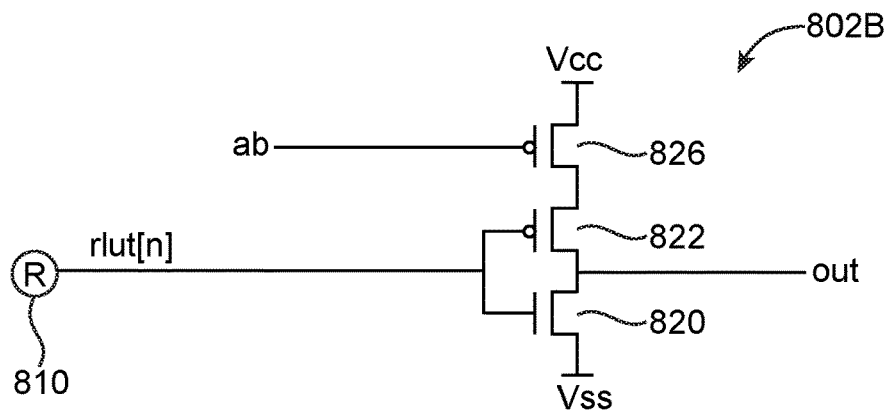
Figure 8C:
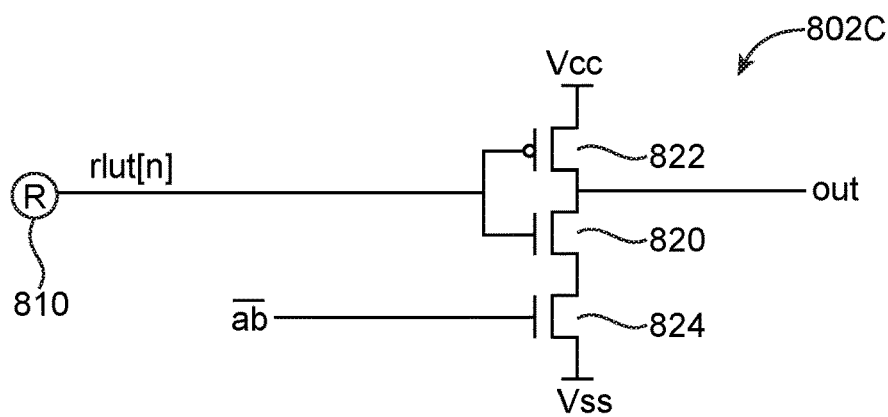
Figure 8D:
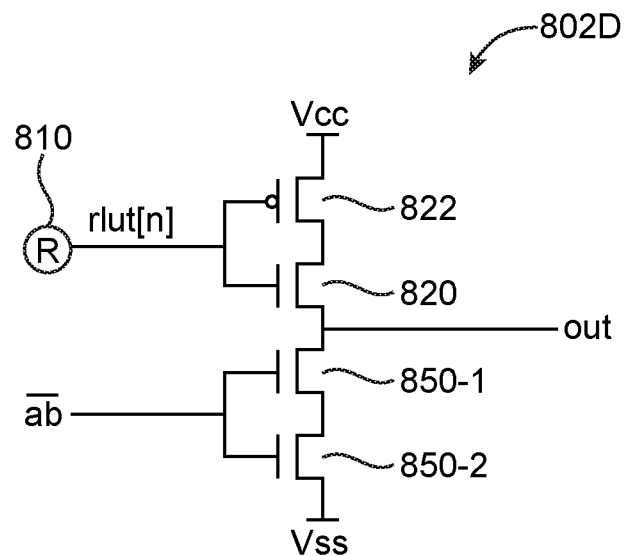
Figure 8E:
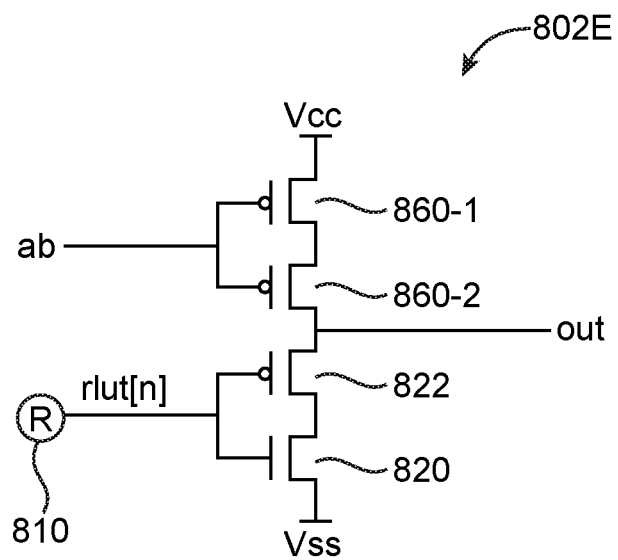

FIG. 8B shows another suitable arrangement in which tristate inverting circuit 802B includes transistor 826 but leaves out transistor 824. FIG. 8C shows another suitable arrangement in which tristate inverting circuit 802C includes transistor 824 but leaves out transistor 826. FIG. 8D shows yet another suitable arrangement in which tristate inverting circuit 802D includes dual stacked pull-down transistors 850-1 and 850-2 that are controlled using the same user signals. FIG. 8E shows yet another suitable arrangement in which tristate inverting circuit 802E includes dual stacked pull-up transistors 860-1 and 860-2 that are controlled using the same user signals.

The embodiments of FIGS. 5-8 showing implementations for a 4:1 multiplexer are merely illustrative and do not serve to limit the scope of the present invention. If desired, the sleep mode configuration of FIGS. 5 and 6 and the tristate configuration of FIGS. 7 and 8 can be applied to 2:1 multiplexers, 8:1 multiplexers, 16:1 multiplexers, or other suitable selection circuitry in one or more lookup table or other configurable logic circuitry on a programmable integrated circuit.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

The foregoing is merely illustrative of the principles of this invention and various modifications can be made by those skilled in the art. The foregoing embodiments may be implemented individually or in any combination.

What is claimed is:

1. An integrated circuit, comprising:
   lookup table circuitry that comprises:
   a tristate inverting circuit that includes only three transistors coupled in series; and
   a memory element that controls at least two of the three transistors in the tristate inverting circuit.

2. The integrated circuit of claim 1, wherein the three transistors comprise two p-channel transistors and one n-channel transistor.

3. The integrated circuit of claim 1, wherein the three transistors comprise two n-channel transistors and one p-channel transistor.

4. The integrated circuit of claim 1, wherein the memory element comprises a configuration random-access memory cell.

5. The integrated circuit of claim 1, wherein the tristate inverting circuit has an output that is coupled between the at least two transistors controlled by the memory element.

6. The integrated circuit of claim 1, further comprising:
   a first power supply line; and
   a second power supply line, wherein the three transistors of the tristate inverting circuit are coupled in series between the first and second power supply lines.

7. The integrated circuit of claim 1, wherein the tristate inverting circuit is part of a multiplexing circuit.

8. The integrated circuit of claim 7, wherein the multiplexing circuit comprises an additional tristate inverting circuit.

9. The integrated circuit of claim 8, wherein the tristate inverting circuit and the additional tristate inverting circuit share the same output.

10. The integrated circuit of claim 1, wherein the tristate inverting circuit further comprises an inverter coupled between gate terminals of the at least two transistors controlled by the memory element.

11. An integrated circuit, comprising:
    lookup table circuitry that includes a tristate inverting circuit, wherein the tristate inverting circuit comprises:
    a first transistor of a given channel type; and
    a second transistor of the given channel type, wherein the second transistor is coupled in series with the first transistor, and wherein the first and second transistors receive the same control signal.

12. The integrated circuit of claim 11, wherein the first and second transistors of the given channel type are n-channel transistors having gate terminals shorted to each other.

13. The integrated circuit of claim 11, wherein the first and second transistors of the given channel type are p-channel transistors having gate terminals shorted to each other.

14. The integrated circuit of claim 11, wherein the tristate inverting circuit further comprises:
    an output; and
    a power supply terminal, wherein the first and second transistors are coupled in series between the output and the power supply terminal.

15. The integrated circuit of claim 11, wherein the tristate inverting circuit further comprises:
    a third transistor coupled in series with the first and second transistors;
    a fourth transistor coupled in series with the first, second, and third transistors, wherein the third and fourth transistors receive a static control signal from a memory cell.

16. An integrated circuit, comprising:
    lookup table circuitry that comprises:
    a tristate inverting circuit having an output; and
    a pass transistor coupled to the output of the tristate inverting circuit, wherein the pass transistor and at least one transistor in the tristate inverting circuit receive the same control signal.

17. The integrated circuit of claim 16, wherein the lookup table circuitry further comprises an additional pass transistor coupled in parallel with the pass transistor.

18. The integrated circuit of claim 16, wherein the tristate inverting circuit further includes first and second transistors that receive a static control bit from a memory cell, and wherein the at least one transistor is coupled in series with the first and second transistors.

19. The integrated circuit of claim 16, wherein the tristate inverting circuit includes only three transistors.

20. The integrated circuit of claim 16, wherein the lookup table circuitry further comprises:
    an additional tristate inverting circuit having an output; and
    an additional pass transistor coupled to the output of the additional tristate inverting circuit, wherein the pass transistor is directly connected to the additional pass transistor.

* * * * *